United States Patent [19]

Tashiro

[11] Patent Number: 5,241,211
[45] Date of Patent: Aug. 31, 1993

[54] SEMICONDUCTOR DEVICE

[75] Inventor: Tsutomu Tashiro, Tokyo, Japan

[73] Assignee: NEC Corporation, Tokyo, Japan

[21] Appl. No.: 773,788

[22] Filed: Oct. 11, 1991

Related U.S. Application Data

[63] Continuation of Ser. No. 630,568, Dec. 20, 1990, abandoned.

[30] Foreign Application Priority Data

Dec. 20, 1989 [JP] Japan .................. 1-332026

[51] Int. Cl.⁵ ............................................. H01L 27/12
[52] U.S. Cl. .................................. 257/506; 257/507;
257/347; 257/622; 257/526
[58] Field of Search ................ 357/49, 50, 55, 60,
357/23.11, 34, 59 H, 59 F; 437/100; 257/506,
507, 347, 526, 622

[56] References Cited

U.S. PATENT DOCUMENTS

| | | | |
|---|---|---|---|
| 4,786,960 | 11/1988 | Jeuch | 357/49 |
| 4,807,012 | 2/1989 | Beasom | 357/49 |
| 4,864,375 | 9/1989 | Teng et al. | 357/49 |
| 4,878,957 | 11/1989 | Yamaguchi et al. | 357/60 X |
| 4,925,805 | 5/1990 | Van Ommen et al. | 257/347 |
| 4,951,102 | 8/1990 | Beitman et al. | 357/49 X |
| 4,982,263 | 1/1991 | Spratt et al. | 357/49 |
| 4,983,538 | 1/1991 | Gotou | 437/100 |
| 5,072,287 | 12/1991 | Nakagawa et al. | 357/49 |

OTHER PUBLICATIONS

Ueno et al., "A Fully Functional 1K ECL RAM on a Bonded SOI Wafer," *IEDM Technical Digest*, 1988, pp. 870–872.

Primary Examiner—Rolf Hille
Assistant Examiner—Roy Potter
Attorney, Agent, or Firm—Burns, Doane, Swecker & Mathis

[57] ABSTRACT

The substrate in a SOI structure is formed of a material with high heat conductivity, a U groove reaches substrate, the buried material inside the U groove is formed of a material with high heat conductivity, and the buried material is brought into contact with the substrate. With this arrangement, the drop in heat radiation effect can be improved while maintaining the enhancement of the resistance to the soft errors and the reduction of the parasitic capacitance on the bottom surface of the semiconductor element, so that the heat radiation effect can be made to approach the heat radiation effect of a semiconductor device having an insulated isolation region of the conventional U-groove structure. Further, in this case the speed and power product can be made better than the speed and power product of a semiconductor device having an insulated isolation region of the conventional U-groove structure.

20 Claims, 7 Drawing Sheets

SEMICONDUCTOR DEVICE

This application is a continuation of application Ser. No. 07/630,568, filed Dec. 20, 1990 now abandoned.

BACKGROUND OF THE INVENTION

1. Field of the Invention

The present invention relates to a semiconductor device, and more particularly to a semiconductor device having a silicon on insulator (SOI) structure and an insulated isolation region of a U-groove structure.

2. Description of the Prior Art

Accompanying the enhancement in the operating speed of silicon semiconductor devices the importance of a method for reducing the parasitic capacitance of a diffused layer or the like that forms a semiconductor became increasingly important. The SOI structure is a powerful method for reducing the parasitic capacitance. In the SOI structure, a single crystal silicon film is formed on a substrate or a film consisting of an insulator, and a semiconductor element is formed on the single crystal silicon film.

In the early days, the SOI structure had a structure of silicon on sapphire or spinel (SOS). It is a structure that has heteroepitaxially grown silicon on the surface of a sapphire or spinel substrate. However, this structure has a disadvantage in the profitability aspect. More important than that, there has been a significant problem in that the structure is difficult to handle and has a drawback in the workability due to too large a difference in the coefficients of thermal expansion between the substrate and the single crystal silicon film.

In the years that followed, along with the advancement in the fine geometry of semiconductor elements, the enhancement of the resistance to the soft errors induced by the $\alpha$ particles has become important. At the same time, along with the advancement in fine geometry of the semiconductor elements, research and development in the three-dimensional devices has been advanced. Together with such a trend there appeared SOI structures with new structures that are different from that of SOS.

These recent SOI structures are of three kinds. In a first structure, a single crystal silicon film is formed on a silicon substrate on whose surface is deposited an insulating film. The method of forming the structure is as follows. An insulating film is formed on the surface of a single crystal silicon film, an amorphous silicon or a polycrystalline silicon deposition film is formed on top of it, and the deposition film is converted to a single crystal by, for example, the irradiation of a laser beam. However, this structure has a defect in the crystallinity of the single crystal silicon film obtained.

In a second type of the recent SOI structures, a silicon oxide film is formed at a small depth from the surface of the single crystal silicon substrate. This structure is called separation by implanted oxygen (SIMOX). It can be obtained by implanting high energy hydrogen ions to the surface of the single crystal silicon substrate at a dose of $10^{17}$ to $10^{18}$ cm$^{-2}$, and annealing the substrate at a high temperature of around 1300° C. The minimum value of the dislocation density in the single crystal silicon layer on the surface of this structure is $10^4$ cm$^{-2}$. The thickness of the silicon oxide film in this case is about 200 nm at the most. In applying the SIMOX structure to an actual device there exist two barriers. A first barrier is the profitability. When the SIMOX structure is attempted to be applied to an actual device, it is necessary to increase the thickness of the silicon oxide film. For the purpose of reducing the parasitic capacitance it is preferred that the thickness of the silicon oxide film beneath the single crystal silicon layer on the surface is large. Disregarding the question about the profitability, this can be realized by repeating several times an operation consisting of ion implantation, high temperature annealing and epitaxial growth of silicon. A second barrier is the junction leak caused by the crystal defects. Within the single crystal silicon layer on the surface of this structure there is distributed oxygen according to the Gaussian law. There are generated stacking faults as well as new dislocations due to the occurrence of the precipitation of the Gaussian distributed oxygens at temperatures of 600° to 700° C., in addition to the presence of the dislocations in the SIMOX structure as grown.

A third type of the recent SOI structures is called bonding and etch back SOI (BESOI). In this structure, a single crystal silicon plate is thermocompression bonded to a substrate which has a silicon oxide film on its surface. This structure has an advantage in that the crystal defect density of single crystal silicon on the silicon oxide film is low and that it can be fabricated inexpensively.

An example of adopting the BESOI struction in a 1K ECL RAM with a Schottky-clamped cell is disclosed IEDM Tech. Digest, 1988, pp. 870–872. In this example, a single crystal silicon plate is thermocompression bonded to a P-type silicon substrate which has a silicon oxide film with thickness of about 1 $\mu$m formed on the surface. An N$^+$-type buried layer is formed by thinning the single crystal silicon plate by etching back, an N$^-$-type epitaxial silicon film is formed on top of it, a U-groove that reaches the silicon oxide film on the P-type silicon substrate is created, an insulating layer is formed on the sidewall surface of the U groove and polycrystalline silicon is buried inside the U groove. A bipolar element is formed in the buried layer and epitaxial layer surrounded by the U groove. The objects of adopting this structure in the aforementioned report are an enhancement of the resistance to the soft errors due to $\alpha$ particles and a reduction of the parasitic capacitance. By the adoption of this structure, the parasitic capacitance between the silicon substrate and the collector region, for example, can be reduced to about one quarter of that in the case of adopting the conventional U-groove structure. It should be noted that the parasitic capacitance between the silicon substrate and the collector region occupies 60 to 70% of that for the entire bipolar element.

A reduction in the parasitic capacitance is important from the viewpoint of enhancing the product of the speed and the power for the purpose of increasing the operating speed of a semiconductor device. An enhancement of the operating speed the semiconductor device has been realized accompanying the advancement in the fine geometry of the semiconductor element that constitutes the semiconductor device. However, the enhancement in the operating speed of the semiconductor device means the passing of a large current in order to drive the fine patterned semiconductor elements. As a result, the current density in the semiconductor element is increased, and the generation of the Joule's heat is also rapidly increased locally. If the heat generation is left as is, there occurs a deterioration in the performance of the semiconductor element. For this reason, a reduction in the parasitic capacitance as well as an enhancement in the radiation effect of the heat generated in the semiconductor element are important for the enhancement of the operating speed of the semiconductor device. Now, there usually exists a gas with low heat conductivity above the semiconductor element. On the other hand, the bottom surface of the semiconductor element is brought into contact either directly or via a material with high heat conductivity with a metallic material that constitutes the package of the semiconductor device. Accordingly, it is typical to radiate the Joule's heat from the semiconductor element from the bottom surface of the semiconductor element.

However, in the BESOI structure described above, the heat radiation effect is inferior to that of the conventional case. The heat conductivity of the silicon oxide film is about two orders of magnitude smaller in comparison to that of single crystal silicon. For this reason, the heat radiation effect at the bottom surface of a bipolar element is reduced. Now, the heat radiation effect can be enhanced by reducing the thickness of the silicon oxide film on the silicon substrate in the BESOI structure. Since the enhancement in the heat radiation effect related to the thickness of the silicon oxide film and the reduction in the parasitic capacitance are in mutually reciprocal relationship so that it is impossible to make these two factors compatible in the BESOI structure described in the report cited above.

BRIEF SUMMARY OF THE INVENTION

Objects of the Invention

It is an object of the present invention to provide a semiconductor device having an SOI structure and an insulated isolation region of a U-groove structure.

It is an object of the present invention to provide a semiconductor device with high resistance to the soft errors.

It is an object of the present invention to provide a semiconductor device with excellent operating speed.

It is an object of the present invention to provide a semiconductor device with excellent operating speed and small parasitic capacitance.

It is an object of the present invention to provide a semiconductor device with excellent heat radiation effect.

It is an object of the present invention to provide a bipolar semiconductor device having an SOI structure and an insulated isolation region of a U-groove structure.

It is an object of the present invention to provide a bipolar semiconductor device with high resistance to the soft errors.

It is an object of the present invention to provide a bipolar semiconductor device with excellent operating speed.

It is an object of the present invention to provide a bipolar semiconductor device with excellent operating speed and small parasitic capacitance.

It is an object of the present invention to provide a bipolar semiconductor device with excellent heat radiation effect.

It is an object of the present invention to provide an MOS semiconductor device having an SOI structure and an insulated isolation region of a U-groove structure.

It is an object of the present invention to provide an MOS semiconductor device with high resistance to the soft errors.

It is an object of the present invention to provide an MOS semiconductor device with excellent operating speed.

It is an object of the present invention to provide an MOS semiconductor device with excellent operating speed and small parasitic capacitance.

It is an object of the present invention to provide an MOS semiconductor device with excellent heat radiation effect.

SUMMARY OF THE INVENTION

The semiconductor device according to the present invention has a single crystal silicon layer on a substrate having a silicon oxide film on the surface, and has an insulated isolation region of a U-groove structure that reaches the substrate from the surface of the single crystal silicon layer. It is preferable that the substrate consists of silicon carbide (SiC). An insulating film is provided on the sidewall surfaces of the U groove. It is preferable that the insulating film consists at least one of a silicon oxide film and a silicon nitride film. Inside the U groove there is buried a buried material via the insulating film. It is preferable that the buried material is polycrystalline silicon or silicon carbide. It is preferable that the sum of the thickness of the single crystal silicon layer provided on the substrate and the thickness of the silicon oxide film formed on the substrate is smaller than the workable depth of the U groove. Further, when the substrate consists of silicon, it is preferable that the thickness of the silicon oxide film formed on the substrate is larger than the thickness of the insulating film provided on the surface of the U-groove sidewalls. It is to be noted that the semiconductor device of the present invention is a bipolar semiconductor device or an MOS semiconductor device.

By adopting the above structure in a semiconductor device of the present invention, it is possible to eliminate the presence of a layer with low heat conductivity between the buried material inside the U groove and the substrate so that heat generated by the semiconductor element is discharged to the substrate via the U groove. As a result of this, the heat radiation effect of the present device is improved over that of the conventional semiconductor device that has a BESOI structure and an insulated isolation region of a U-groove structure. Even if the heat radiation effect remains lower than that of a semiconductor device having an insulated isolation region of the conventional U-groove structure, the product of the speed and the power will be improved over that of a semiconductor device having an insulated isolation region of the conventional U-groove structure due to the effect of reduction of the parasitic capacitance in the semiconductor device of the present invention. Further, the resistance to the soft errors of the semiconductor device of the present invention is improved over that of a semiconductor device having an insulated isolation region of the conventional U-groove structure due to the adoption of a BESOI structure.

It should be added that when the present invention is applied to a bipolar semiconductor device, the aforementioned effect can also be obtained. On the other hand, when the present invention is applied to an MOS semiconductor device, the effectiveness of the present invention will become extremely significant provided that the fine geometry for an MOS semiconductor element is further advanced to a level, for example, of a gate length of 0.1 to 0.25 μm, the operating speed approaches 1 GHz and the operating temperature becomes comparable to the temperature of liquid nitrogen.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Prior to proceeding to the description of the embodiments of the present invention, a description of the prior art by reference to a drawing is in order.

Figure 1:
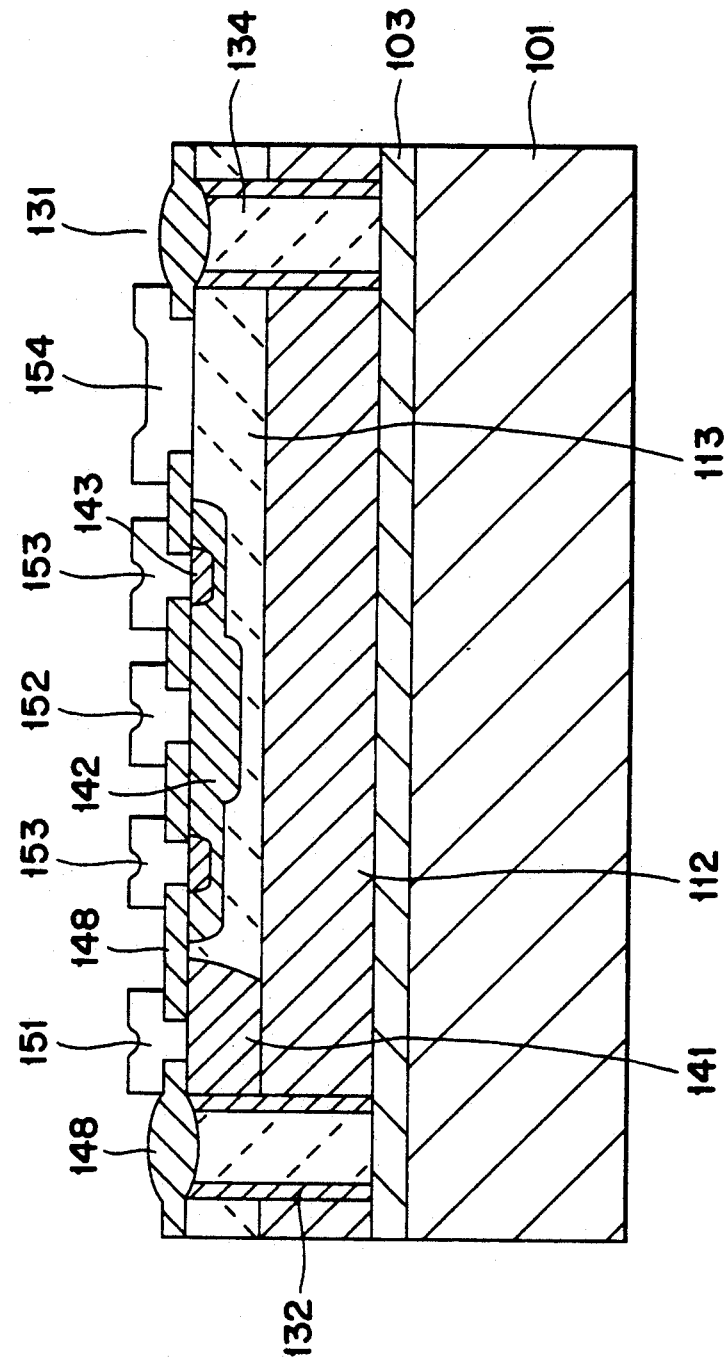
FIG. 1 is a schematic sectional view for describing a semiconductor device having a conventional SOI structure and a U-groove structure.

FIG. 1 is a schematic sectional view of a semiconductor device in which the aforementioned BESOI structure is adopted in a 1K ECL RAM with a Schottky-clamped cell given in the report, IEDM Tech. Digest, 1988, pp. 870-872.

This semiconductor device has the following constitution. For example, a silicon oxide film 103 with a thickness of about 1 μm is formed on the surface of a P-type silicon substrate 101. A single crystal silicon plate thermocompression bonded to the surface of the silicon oxide 103 is thinned by an etch back, an N-type impurity is introduced in it to form an N+-type buried layer 112. Then, an N--type epitaxial silicon film 113 is deposited on the surface of the buried layer 112. The single crystal silicon layer in this case is constituted of the buried layer 112 and the epitaxial silicon film 113. A U groove 131 which reaches from a predetermined position on the surface of the epitaxial silicon film 113 to the silicon oxide film 103 is provided. On the sidewall surface of the U groove 131 there is formed a sidewall film 132 which has a thickness smaller than that of the silicon oxide film 103. Inside the U groove 131 there is buried polycrystalline silicon 134 via the sidewall insulating film 132. On the surface of the epitaxial silicon film 113 there are provided an N+-type region 141, a P+-type base region 142 and an N+-type emitter region 143. The narrow sense N+-type collector region consists of the buried layer 112 and the N+-type region 141. The wide sense collector region consists of the portion of the epitaxial silicon film 113 which is left without forming the diffused region, the buried layer 112 and the N+-type region 141. A surface protective film 148 is provided on the surface of the epitaxial silicon film 113, the N+-type region 141, the P+-type base region 142, the N+-type emitter region 143 and the U groove 131. A collector electrode 151, a base electrode 152, an emitter electrode 153 and a Schottky electrode 154 are provided via openings formed in the N+-type region 141, the P+-type base region 142, the N+-type emitter region and the epitaxial silicon film 113, respectively, of the surface protective film 148.

The parasitic capacitance ($C_{CS}$) between the wide sense collector region and the substrate is the sum of the parasitic capacitance ($C_{CS(B)}$) between the bottom surface of the wide sense collector region and the parasitic capacitance ($C_{CS(S)}$) between the side faces of the wide sense collector region and the substrate. The $C_{CS(B)}$ in the above-mentioned semiconductor device is smaller than that of the conventional semiconductor device due to the presence of the thick silicon oxide film 103 between the silicon substrate 101 and the wide sense collector region. The $C_{CS(S)}$ in the above-mentioned semiconductor device is the same as that of the conventional bipolar semiconductor device. Because of the reduction in the $C_{CS(B)}$ the value of the $C_{CS}$ becomes about one quarter of that of the conventional bipolar semiconductor device. Here, the $C_{CS(S)}$ is constituted of the capacitance ($C_{CI}$) formed between the side faces of the wide sense collector region and the polycrystalline silicon 134 and the capacitance ($C_{IS}$) formed between the polycrystalline silicon 134 and the silicon substrate 101. Due to the difference in the thicknesses and the opposing areas, a relation $C_{CI} >> C_{IS}$ becomes valid.

On the other hand, in the bipolar semiconductor device of the above-mentioned structure, the radiation effect of the heat generated by the bipolar element is lower than the heat radiation effect of a bipolar semiconductor device that has an insulated isolation region of the conventional U-groove structure due to the presence of a thick silicon oxide film 103 between the buried layer 112 and the silicon substrate 101.

Next, referring to the drawings, the present invention will be described.

The case of applying the first embodiment of the present invention to a bipolar semiconductor device will be described by making reference to the schematic sectional views, FIG. 2A to FIG. 2D, as arranged in the order of the fabrication processes.

First, a silicon oxide film 203 with thickness of about 1.0 μm is formed on the surface, for example, of a P-type silicon substrate 201. A high voltage is applied under a high temperature to a single crystal silicon plate overlaid on the surface of the silicon oxide film 203 to be thermocompression bonded to the film 203. Following that, the single crystal silicon plate is etched back to obtain a single crystal silicon plate 211 with thickness of about 1.0 μm [FIG. 2A].

Next, an N+-type buried layer 212 is formed by diffusing arsenic into the single crystal silicon plate 211.

After that, an N--type epitaxial silicon film 213 with thickness of about 1.0 μm is deposited on the surface of the buried layer 212. The single crystal silicon layer in the bipolar semiconductor device to which is applied the present embodiment consists of the epitaxial silicon film 213 and the buried layer 212. Then, a silicon oxide film 221 and a silicon nitride film 222 are sequentially formed on the surface of the epitaxial silicon film 213. Next, a U groove 231 which reaches from the surface of the single crystal silicon to the silicon substrate 201, by penetrating the epitaxial silicon film 213, the buried layer 212 and the silicon oxide film 203, is formed by carrying out an anisotropic etching by means of the ordinary photolithography technique and the reactive ion etching (referred to as RIE hereinafter). The width and the depth of the U groove 231 are about 1.0 $\mu$m and about 4 $\mu$m, respectively. The area of the bottom surface of the buried layer 212 divided by the U grooves 231 is $10 \times 20$ $\mu m^2$. Following that, a silicon oxide film 233 with a thickness of about 0.1 $\mu$m is formed all over the surface by means of a high temperature CVD (referred to as HTCVD hereinafter) method [FIG. 2B]. The reason for employing the HTCVD is that it is possible to obtain an excellent step coverage, and that the quality of the deposited film obtained is excellent (for the case of the silicon oxide film, it has substantially the same quality as the silicon oxide film obtainable by thermal oxidation). It is to be noted that a silicon oxide film by thermal oxidation or a silicon nitride film by the CVD method may be used in stead of the silicon oxide film in the above.

Then, the silicon oxide film is subjected to an etch back by RIE to remove the surface of the silicon nitride film 222 and the silicon oxide film 233 at the bottom part of the U groove 231, leaving the silicon oxide film 233 only on the sidewall surface of the U groove 231. The remaining silicon oxide film is to function as a sidewall insulating film. Following that, polycrystalline silicon is deposited all over to a thickness of about 2.0 $\mu$m, the film is etched back and polycrystalline silicon 234 is formed buried inside the U groove 231. At the time of the etch back, the silicon nitride film 222 functions as a stopper. Then the silicon nitride film 222 and the silicon oxide film 221 formed on the surface are sequentially removed by etching. Next, an N$^+$-type region 241 is formed that is connected to the buried layer 212 by selectively diffusing phosphorus into the surface of the epitaxial silicon film 213. In this manner, the formation of a narrow sense collector region consisting of the buried layer 212 and the N$^+$-type region 241 is completed [FIG. 2C].

Next, a P$^+$-type base region 242 with a diffused layer depth of about 0.3 $\mu$m and a surface area of $10 \times 12$ $\mu m^2$ is formed by selectively implanting boron into the surface of the epitaxial silicon film 213. The formation of a wide sense collector region is completed in this stage. This region consists of the epitaxial silicon film 213 excluding the base region 242, the N$^+$-type region 241 and the buried layer 212. Then, a silicon oxide film 249 with a thickness of about 0.2 $\mu$m is formed all over the surface as an insulating film for surface protection. Openings are selectively formed in the silicon oxide film 249, phosphorus is diffused, and an N$^+$-type emitter region 243 is formed. Following that, openings are selectively formed in the silicon oxide film 249, and there are formed a collector electrode 251, a base electrode 252 and an emitter electrode 253 are formed that are connected to the N$^+$-type region 241, the base region 242 and the emitter region 243, respectively, via the above-mentioned openings [FIG. 2D]. These electrodes are formed, for example, by an aluminum film.

Figure 2A:
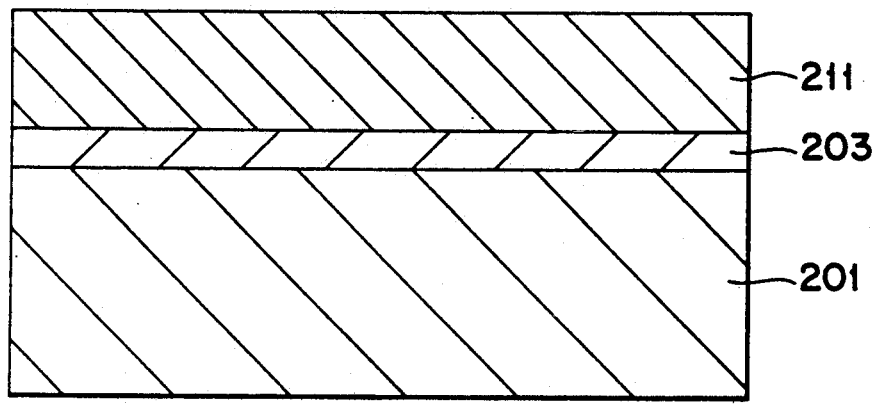
FIG. 2A to FIG. 2D show schematic sectional views arranged in the order of fabrication processes for describing a first embodiment of the present invention.
Figure 2B:
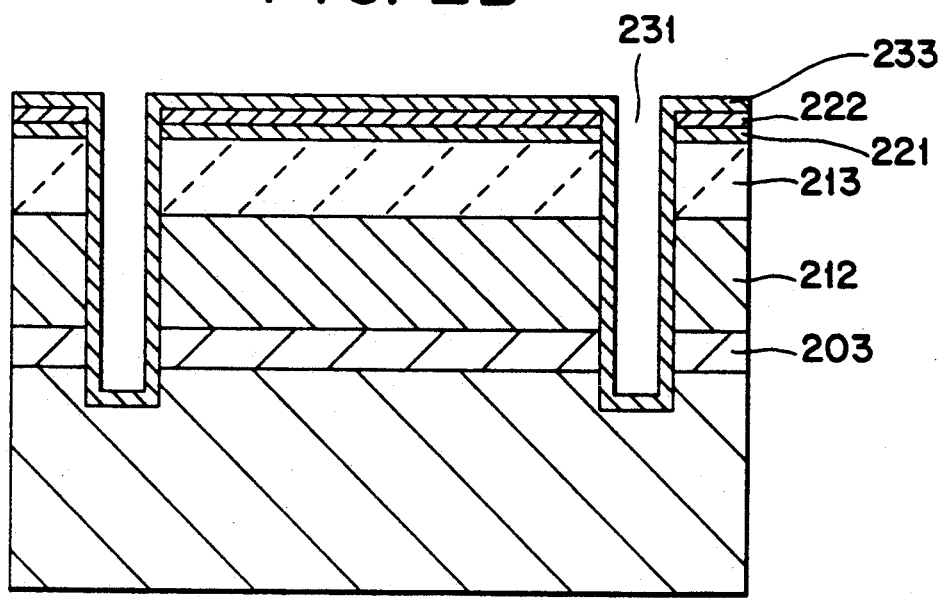
Figure 2C:
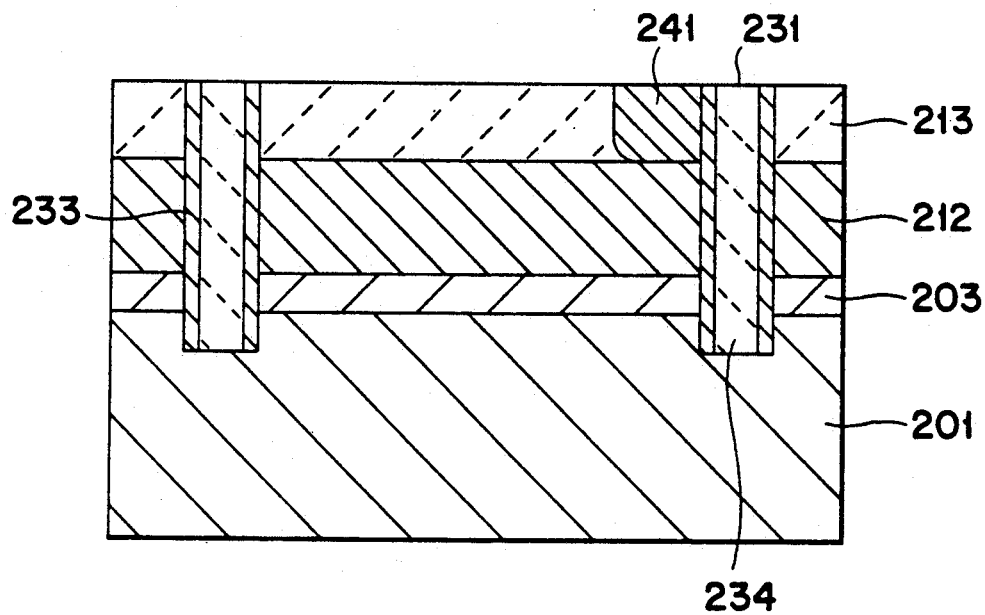
Figure 2D:
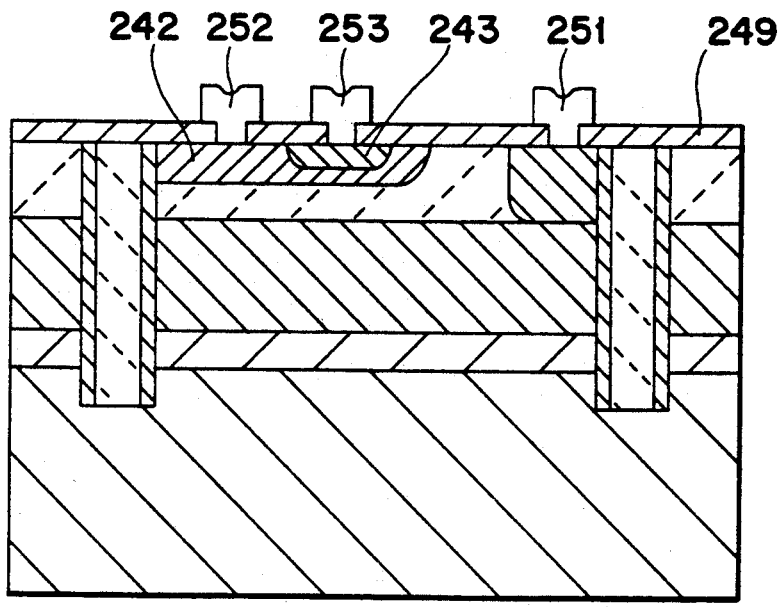
Figure 3:
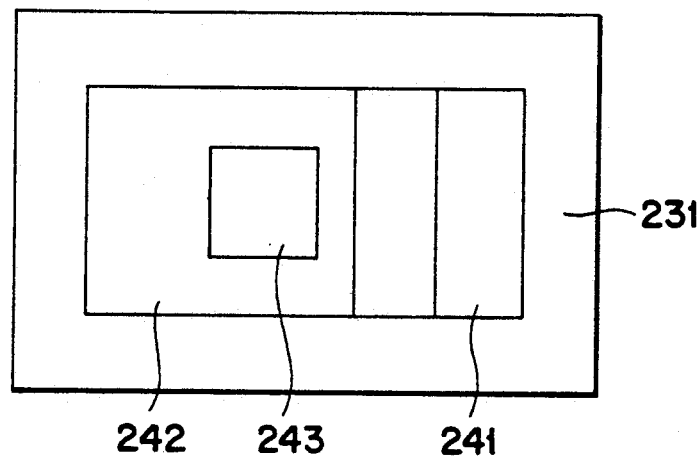
FIG. 3 is a schematic plan view corresponding to FIG. 2D for describing the first embodiment of the present invention.

FIG. 3 is a schematic plan view that corresponds to FIG. 2D. The area of the bottom surface of the collector region that is brought into contact with the silicon oxide film 203 is the same as the area of the bottom surface of the buried layer 212 divided by the U grooves 231, which is 200 $\mu m^2$. Further, from the fact that the area of the side faces of the base region 242 is $0.3 \times (10 + 2 \times 12)$ $\mu m^2$ (which is about 10 $\mu m^2$), the area of contact of the wide sense collector region with the U groove 231 becomes equal to $(1+1) \times (2 \times 10 + 2 \times 20)$ $\mu m^2 - 10$ $\mu m^2 = 110$ $\mu m^2$.

A bipolar semiconductor device that has a conventional BESOI structure and an insulated isolation region of a U-groove structure, and a bipolar semiconductor device that has an insulated isolation region of the conventional U-groove structure are fabricated. The raw materials used and the dimensions of the various components these devices are set to be identical to those of the present embodiment. These bipolar semiconductor devices and the bipolar semiconductor device in accordance with the present embodiment were compared.

The parasitic capacitance ($C_{CS}$) between the wide sense collector region and the silicon substrate for the bipolar semiconductor device according to the present embodiment was about one quarter of that of a bipolar semiconductor device that has an insulated isolation region of the conventional U-groove structure, similar to that of the prior art as shown in FIG. 1. If the raw materials and the dimensions of the various components are set as shown in the present embodiment, there is obtained $C_{CS(S)} = 5.5$ $C_{CS(B)}$ for the bipolar semiconductor device by the present embodiment and the prior art as shown in FIG. 1, so that $C_{CS(S)}$ ($= C_{CI}$) becomes dominant in $C_{CS}$. The value of the $C_{CS(B)}$ for the bipolar semiconductor device that has an insulated isolation region of the conventional U-groove structure is substantially the same as in the above. That the above-mentioned result was obtained notwithstanding means that the $C_{CS(B)}$ is drastically reduced to about 1/20 of that of the ordinary case by the adoption of the SOI structure.

Figure 4:
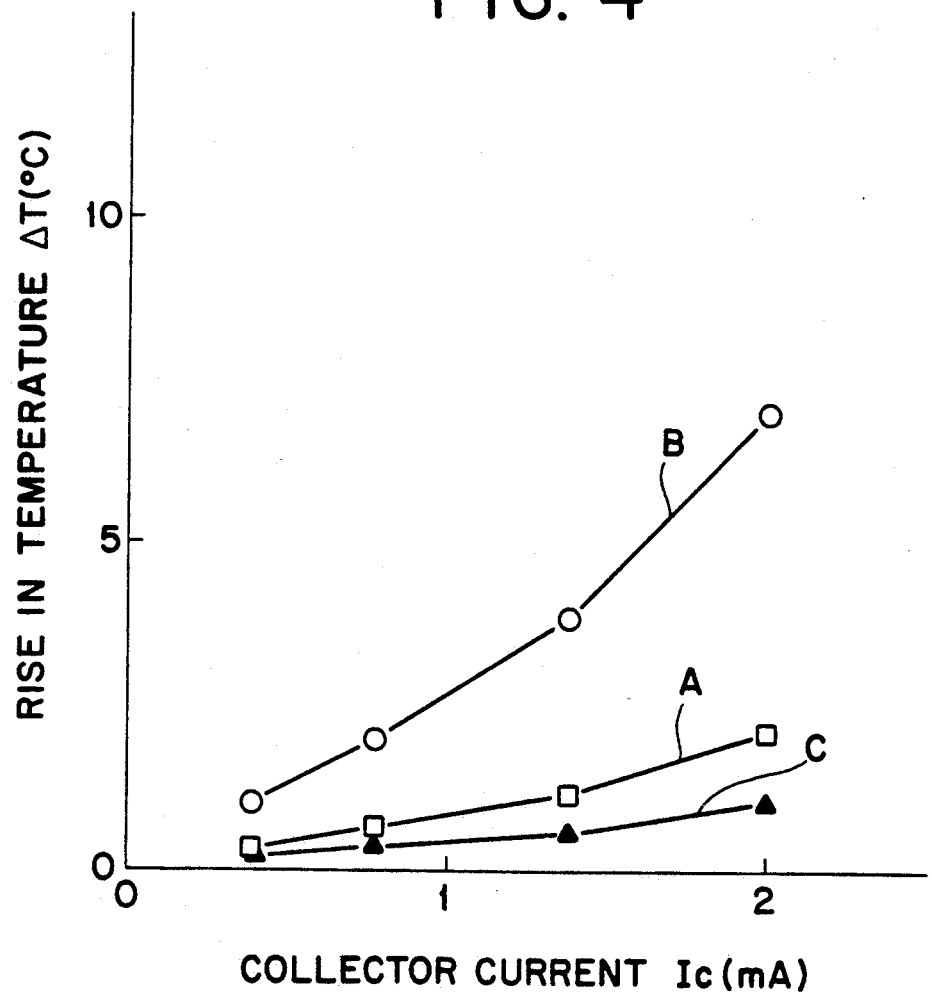
FIG. 4 is a graph showing the dependence of the rise in temperature of the semiconductor device on the collector current for describing the first embodiment of the present invention.

In the bipolar semiconductor device in accordance with the present embodiment, the heat radiation from the side surfaces of the bipolar element dominates the heat radiation from the bottom surface. The dependence of the rise in temperature $\Delta T$ of the semiconductor device on the collector current $I_C$ was measured for the above-mentioned three kinds of bipolar semiconductor devices. The result is shown in FIG. 4. In the figure, the curve A is the measurement result for the present embodiment and the curve B is the measurement result for the bipolar semiconductor device with the structure as shown in FIG. 1. In addition, the curve C is the measurement result for the bipolar semiconductor device that has an insulated isolated region of the conventional U-groove structure. The heat radiation effect can be compared by the comparison of the reciprocals of $\Delta T$ of the figure. The heat radiation effect of the bipolar semiconductor device that has the structure as shown in FIG. 1 is about 1/6 of the heat radiation effect of the bipolar semiconductor device that has an insulated isolation region of the conventional U-groove structure. In contrast, the ratio is about ½ for the device of the present embodiment. Now, let us consider the product of the speed and the power by assuming that the $C_{CS}$ occupies 60% of the total parasitic capacitance. The speed and power product for the semiconductor device with the structure shown in FIG. 1 is about 40% of the speed and power product for the bipolar semiconductor device that has an isolated isolation region of the conventional U-groove structure. On the other hand, the speed and power product for the present embodiment is about 120% of the speed and power product for the bipolar semiconductor device that has an insulated isolation region of the conventional U-groove structure. This fact indicates the following thing. Namely, in the present embodiment, the heat radiation effect falls below that of the bipolar semiconductor device that has an insulated isolation region of the conventional U-groove structure, but the effect due to the reduction in the parasitic capacitance makes up more than that fall. In addition, the resistance to the soft errors for the present embodiment is improved over that for the bipolar semiconductor device that has an insulated isolation region of the conventional U-groove structure.

When the fine geometry for the bipolar element advances further, the degree of reduction of the side face area of a bipolar element becomes smaller than the degree of reduction of the bottom face area. Because of this, a structure with high heat radiation effect from the side face becomes the more effective. Incidentally, when the heat radiation effect from the side face alone is compared, the present embodiment is superior to the bipolar semiconductor device that has an insulated isolation region of the conventional U-groove structure.

It should be mentioned that the present embodiment can be applied to an MOS semiconductor device, although the present embodiment represents an example of the application to a bipolar semiconductor device. In the application to an MOS semiconductor device, first, the thickness of the single crystal silicon plate 211 shown in FIG. 2A is formed thin to about 0.2 to 0.5 μm. Then, an insulated isolation region of the U-groove structure is formed, followed by the formation of an MOS element. The parasitic capacitance in the MOS semiconductor device is mainly contributed by that of the source and drain region. When the present embodiment is applied to this MOS semiconductor device, the parasitic capacitance can be reduced to about 1/20 except for the prastic capacitance of the opposing side faces of the source and drain region of the channel region. Because of this, it is possible to obtain an effect similar to that of the bipolar semiconductor device described in the above.

Figure 5:
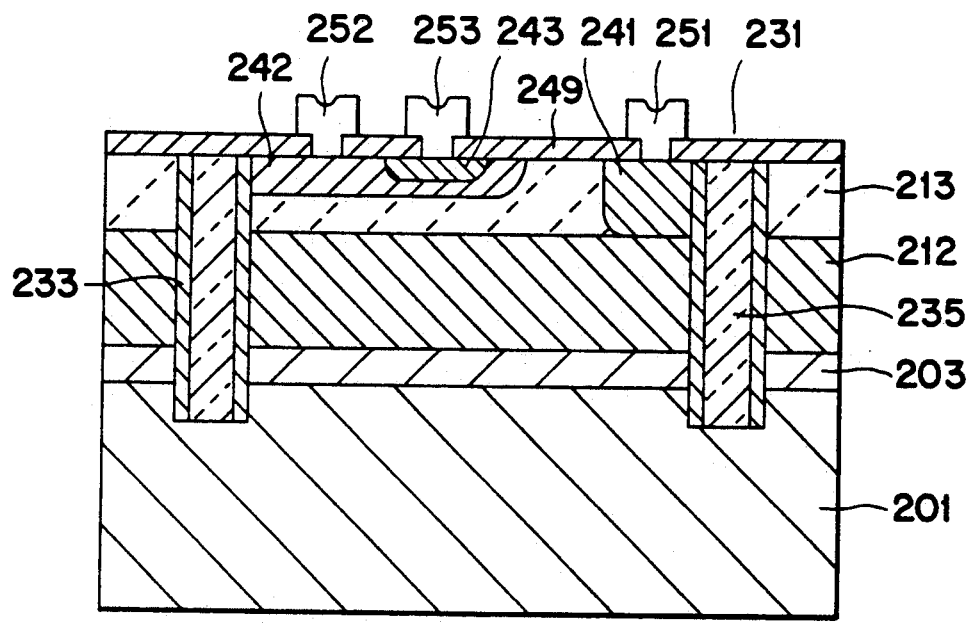
FIG. 5 is a schematic sectional view for describing an example of applying a second embodiment of the present invention to a bipolar semiconductor device.
Figure 6:
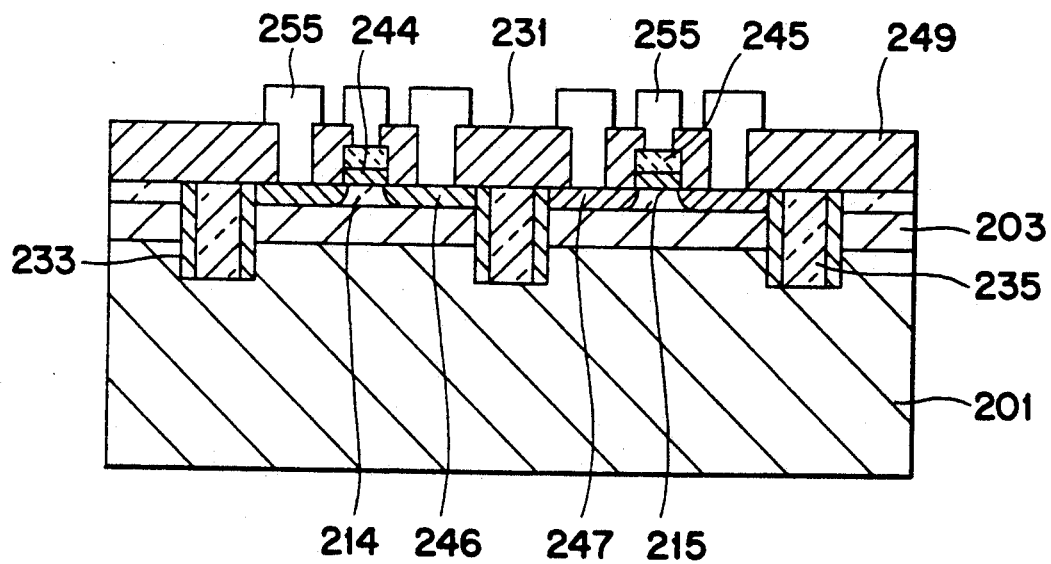
FIG. 6 is a schematic sectional view for describing an example of applying the second embodiment of the present invention to an MOS semiconductor device.

FIGS. 5 and 6 are the schematic sectional views for describing the second embodiment of the present invention. FIG. 5 is an example when the present embodiment is applied to a bipolar semiconductor device, and FIG. 6 is an example when it is applied to an MOS semiconductor device. In the present embodiment, the material to be buried inside the U groove 231 is silicon carbide 235 instead of polycrystalline silicon in the first embodiment.

In the bipolar semiconductor device shown in FIG. 5, the conditions are identical to the first embodiment except that silicon carbide 235 is used. Therefore, the method of formation of silicon carbide 235 will be described below. First, a silicon oxide film 233 is formed on the surface of the side-walls of the U groove 231. In this situation, the surface of a single crystal silicon layer (consisting of a buried layer 212 and an epitaxial silicon film 213) is covered with a silicon nitride film or the like. Following that, silicon carbide 235 is selectively deposited inside the U groove 231 by means of a CVD method which uses a mixed gas consisting of $SiH_2Cl_2$, $C_3H_8$, HCl and $H_2$ at a temperature of about 600° C.

Next, the MOS semiconductor device shown in FIG. 6 will be described. The single crystal silicon layer in this case consists of a P well 214 and an N well 215. The thickness of the single crystal silicon layer is in the range of 0.2 to 0.5 μm. A source and drain region is formed in self-aligned fashion with respect to a gate insulating film 244 and a gate electrode 245. An $N^+$-type source and drain region 246 is formed in the P well 214, and a $P^+$-type source and drain region 247 is formed in the N well 215. The base portions of the source and drain regions 246 and 247 are brought into contact with the silicon oxide film 203. The source and drain regions 245 and 246 are formed in self-aligned fashion to the U groove 231 except for the channel region side. Metallic wirings 255 that are connected to the gate electrode 245, the source and drain region 246 and a source and drain region 247 via the openings that are provided in the silicon oxide film 249 which is a surface protective film.

Now, the heat conductivity of silicon carbide is two to three times the heat conductivity of polycrystalline silicon. Because of this, the semiconductor device of the present embodiment has an improved heat radiation effect from the side faces of the semiconductor element over that of the first embodiment.

Figure 7:
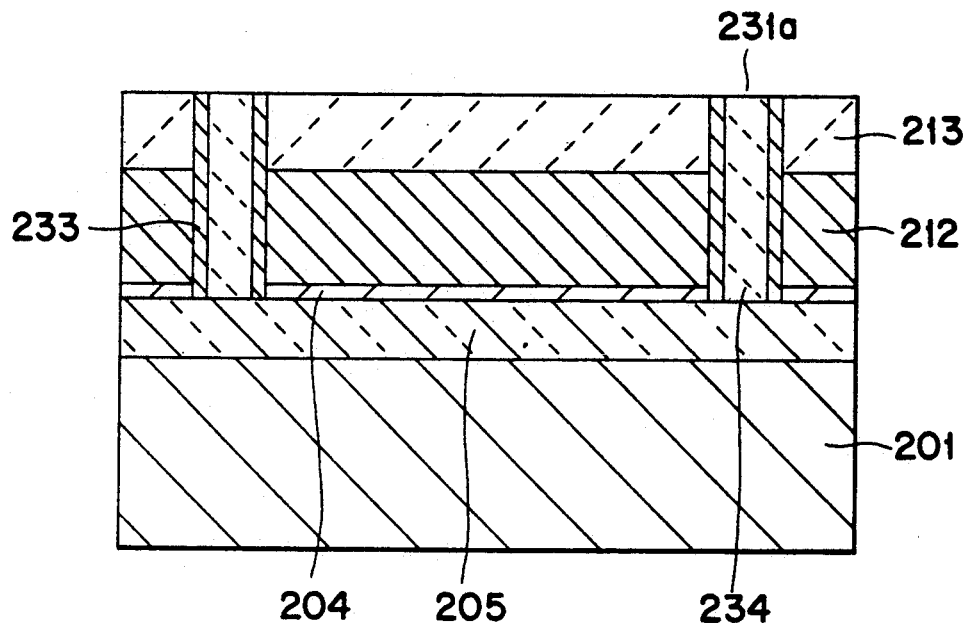
FIG. 7 is a schematic sectional view for describing a third embodiment of the present invention.

FIG. 7 is a schematic sectional view for describing the third embodiment of the present invention. The figure shows the condition prior to the formation of a bipolar element in a bipolar semiconductor device. The present embodiment can also be applied to an MOS semiconductor device analogous to the first and the second embodiments. In the present embodiment, use is made of a substrate in which a silicon carbide film 205 is formed on a silicon substrate 201 by a CVD method. The thickness of the silicon carbide film 205 is about 2 to 5 μm. The thickness of the silicon oxide 204 is about 0.1 to 0.5 μm. It is preferable that the silicon oxide film 204 is formed by the HTCVD method. The silicon oxide film 204 is necessary for obtaining a BESOI structure. If the operating speed is 1 GHz, for example, the setting of these two films is carried out by considering the fact that the dielectric constant of silicon carbide is about four times that of the silicon oxide film. Other conditions of the present embodiment are the same as in the first embodiment.

In the present embodiment, the heat radiation effect on the bottom surface of the bipolar element is improved over those of the first and the second embodiments. The heat radiation effect on the side face of the bipolar element is improved somewhat over that of the first embodiment due to the fact that a U groove 231a is connected to the silicon carbide film which has high heat conductivity. Further, a similar effect can be obtained in the case of applying the present embodiment to an MOS semiconductor device.

Figure 8:
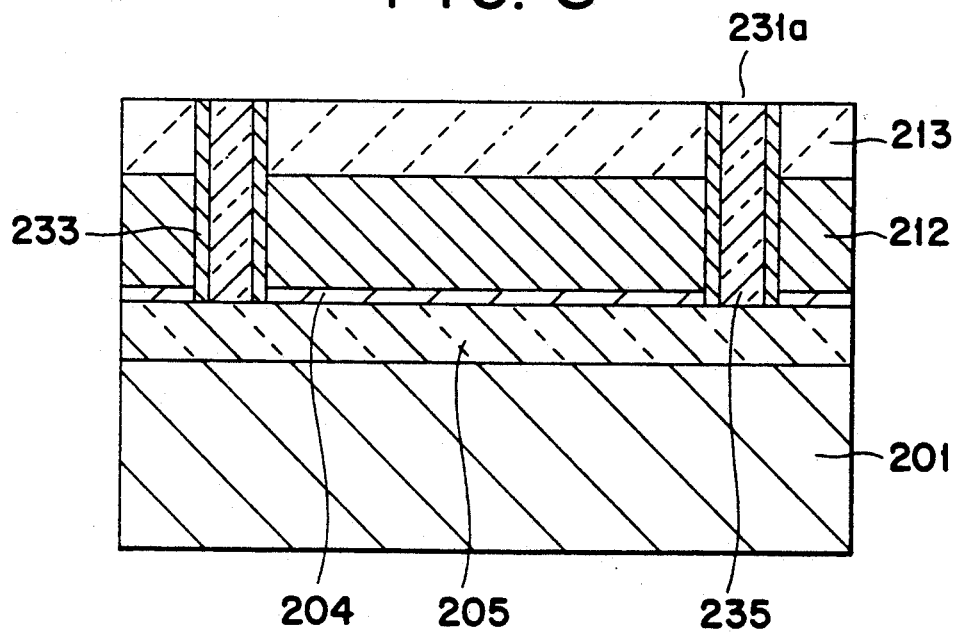
FIG. 8 is a schematic sectional view for describing a fourth embodiment of the present invention.

FIG. 8 is a schematic sectional view for describing the fourth embodiment. The figure shows the condition before the formation of a bipolar element in a bipolar semiconductor device. The present embodiment can also be applied to an MOS semiconductor device similar to the first, the second and the third embodiments. The difference of the present embodiment from the third embodiment is that the material buried in the U groove 231a is silicon carbide 235.

In the present embodiment, the heat radiation effect on the side face of the semiconductor element is further improved over that of the third embodiment.

Figure 9:
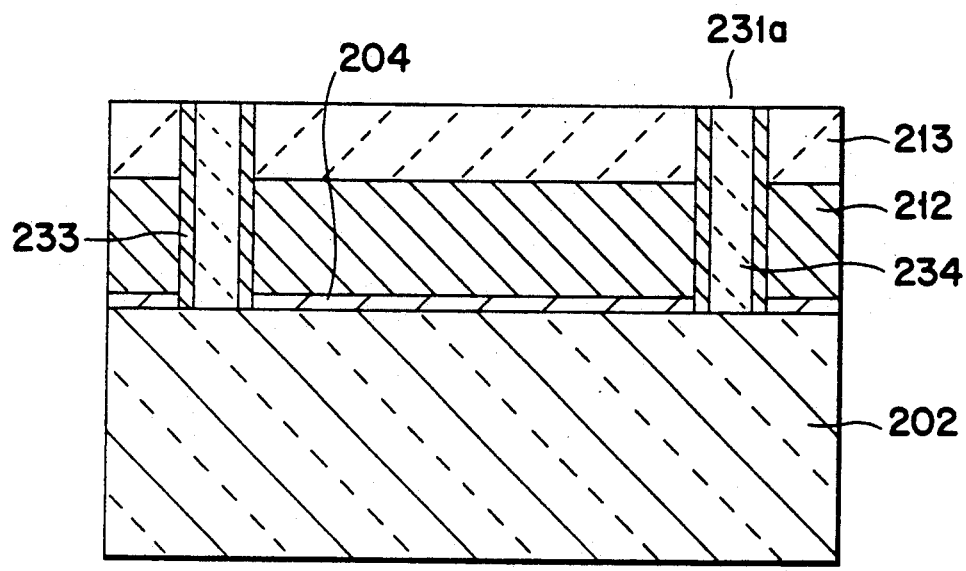
FIG. 9 is a schematic sectional view for describing a fifth embodiment of the present invention.

FIG. 9 is a schematic sectional view for describing the fifth embodiment of the present invention. The figure shows the condition before the formation of a bipolar element in a bipolar semiconductor device. The present embodiment can also be applied to an MOS semiconductor device similar to the first, the second, the third and the fourth embodiments. In the present embodiment, polycrystalline silicon 234 is buried inside a U groove 231a. Further, a silicon carbide substrate 202 is used as a substrate. Because of this, the restrictions on the film thickness related to the dielectric constant for the silicon oxide film 204 in the third and the fourth embodiments can be eliminated. The thickness of the silicon oxide film 204 is preferable to be made small from the view point of heat radiation. However, a thickness required for sticking the single crystal silicon layer is needed. As the thickness of the silicon oxide film 204, it is preferable that it is about 0.05 to 0.1 μm. In the present embodiment, the heat radiation effect on the bottom surface of the semiconductor element is improved over those of the first, the second, the third and the fourth embodiments, and the parasitic capacitance on the bottom surface of the semiconductor element is also reduced.

Figure 10:
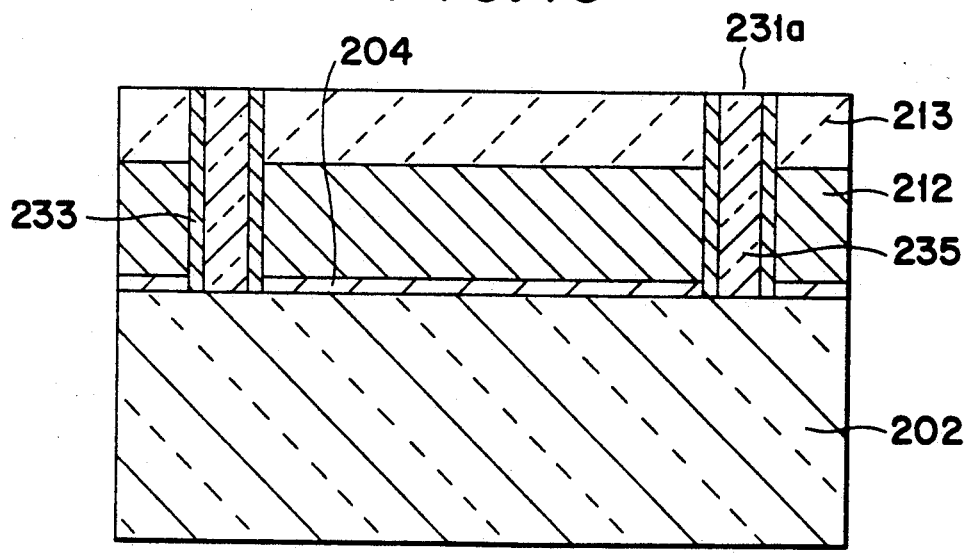
FIG. 10 is a schematic sectional view for describing a sixth embodiment of the present invention.

FIG. 10 is a schematic sectional view for describing the sixth embodiment of the present invention. The figure shows the condition before the formation of a bipolar element in a bipolar semiconductor device. The present embodiment can also be applied to an MOS semiconductor device similar to the first, the second, the third, the fourth and the fifth embodiments. The difference of the present embodiment from the fifth embodiment is that the material buried inside the U groove 231a is silicon carbide 235. In the present embodiment, the heat radiation effect on the side faces of the semiconductor device is improved over that of the fifth embodiment, and the parasitic capacitance at the side faces of the semiconductor element is also reduced.

Although the invention has been described with reference to the specific embodiments, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any modifications or embodiments as fall within the true scope of the invention.

I claim:

1. A semiconductor device comprising:
    a substrate having a silicon oxide film on a surface thereof;
    a single crystal silicon element formation layer located on a surface of said silicon oxide film;
    a U-shaped groove that reaches from a surface of said single crystal silicon layer through said silicon oxide film to said substrate;
    a side wall insulating film located on side walls of said U-shaped groove; and
    polycrystalline silicon buried between said side walls of said U-shaped groove with said side wall including film, said polycrystalline silicon directly contacting said substrate at a bottom of said U-shaped groove.

2. A semiconductor device as claimed in claim 1, wherein said semiconductor device is a bipolar semiconductor device.

3. A semiconductor device according to claim 2, wherein said element formation layer includes an epitaxial layer and a buried layer.

4. A semiconductor device as claimed in claim 1, wherein said semiconductor device is an MOS semiconductor device.

5. A semiconductor device according to claim 3, wherein said element formation layer includes an epitaxial layer and a buried layer.

6. A semiconductor device as claimed in claim 1, wherein said substrate is a silicon substrate.

7. A semiconductor device as claimed in claim 6, wherein said semiconductor device is a bipolar semiconductor device.

8. A semiconductor device according to claim 7, wherein said element formation layer includes an epitaxial layer and a buried layer.

9. A semiconductor device as claimed in claim 6, wherein said semiconductor device is an MOS semiconductor device.

10. A semiconductor device according to claim 9, wherein said element formation layer includes an epitaxial layer and a buried layer.

11. A semiconductor device according to claim 6, wherein said element formation layer includes an epitaxial layer and a buried layer.

12. A semiconductor device as claimed in claim 1, wherein said silicon oxide film has a thickness which is smaller than the difference between the depth of said U-shaped groove and a thickness of said single crystal silicon layer, and larger than the thickness of said side wall insulating film.

13. A semiconductor device as claimed in claim 12, wherein said semiconductor device is a bipolar semiconductor device.

14. A semiconductor device as claimed in claim 12, wherein said semiconductor device is an MOS semiconductor device.

15. A semiconductor device according to claim 12, wherein said element formation layer includes an epitaxial layer and a buried layer.

16. A semiconductor device as claimed in claim 1, wherein said substrate is a silicon carbide substrate.

17. A semiconductor device as claimed in claim 16, wherein said semiconductor device is a bipolar semiconductor device.

18. A semiconductor device as claimed in claim 16, wherein said semiconductor device is an MOS semiconductor device.

19. A semiconductor device according to claim 16, wherein said element formation layer includes an epitaxial layer and a buried layer.

20. A semiconductor device according to claim 1, wherein said element formation layer includes an epitaxial layer and a buried layer.

* * * * *